United States Patent [19]

Makino et al.

[11] 4,331,890

[45] May 25, 1982

[54] TOUCH SWITCH

[75] Inventors: Yoshimitsu Makino, Hachioji; Akira Orii, Sagamihara, both of Japan

[73] Assignee: Janome Sewing Machine Co. Ltd., Tokyo, Japan

[21] Appl. No.: 101,748

[22] Filed: Dec. 6, 1979

[30] Foreign Application Priority Data

Dec. 22, 1978 [JP] Japan ................................. 53/158809

[51] Int. Cl.³ .......................................... H01H 36/00
[52] U.S. Cl. ..................................... 307/326; 307/115; 340/365 E; 112/277
[58] Field of Search .................. 307/115, 116, 117, 98, 307/139, 143, 141, 141.4, 326; 340/365 E, 365 C; 112/158 E, 277; 200/DIG. 1, 181

[56] References Cited

U.S. PATENT DOCUMENTS

| | | | |
|---|---|---|---|
| 3,787,732 | 1/1974 | Larson | 307/116 |
| 4,161,918 | 7/1979 | Dunn | 307/115 |
| 4,242,667 | 12/1980 | Hunts | 340/365 E |

*Primary Examiner*—L. T. Hix
*Assistant Examiner*—Stafford D. Schreyer
*Attorney, Agent, or Firm*—Michael J. Striker

[57] ABSTRACT

A touch switch is composed of a first and a second touch electrodes which are adjacently arranged on a furnishing panel via an insulating substance and a circuit for processing an output therefrom and giving an effective output only when said electrodes are operated within a specific timing range.

3 Claims, 9 Drawing Figures

FIG_1
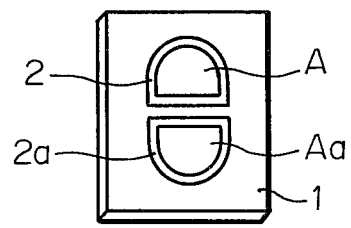
FIG_5
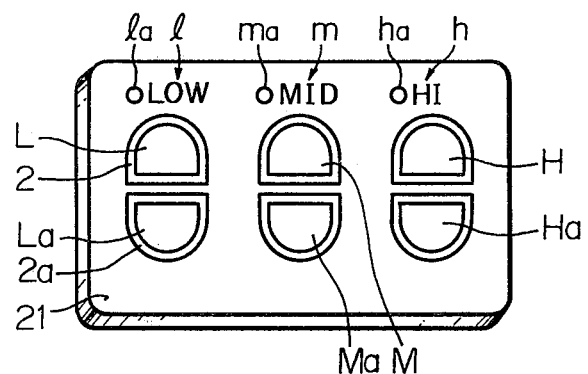
FIG_8
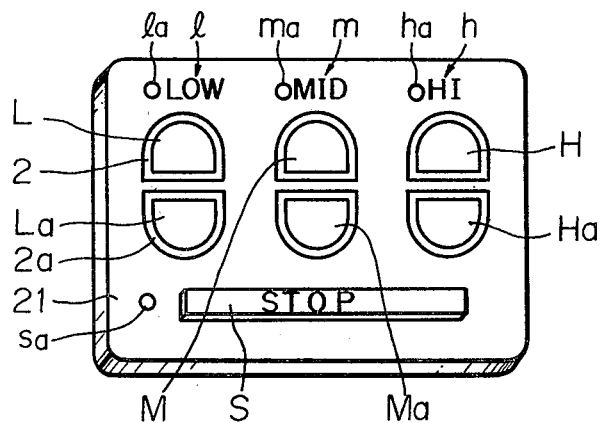

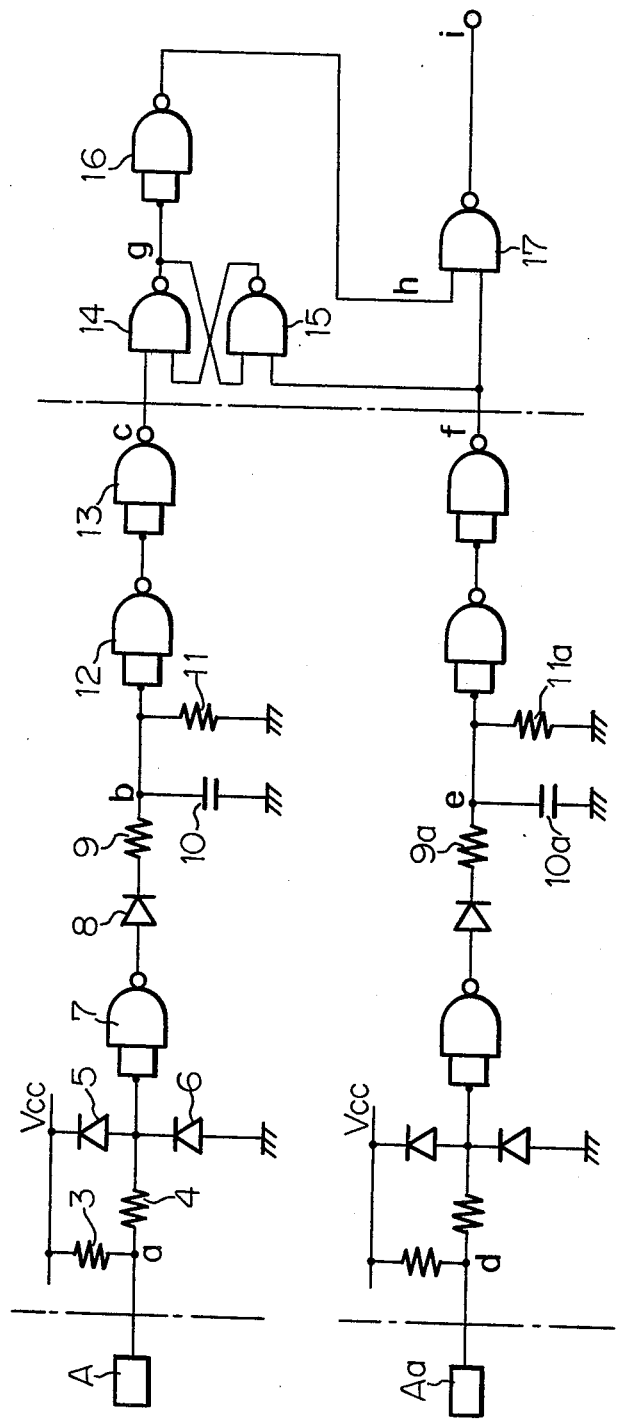
FIG._2

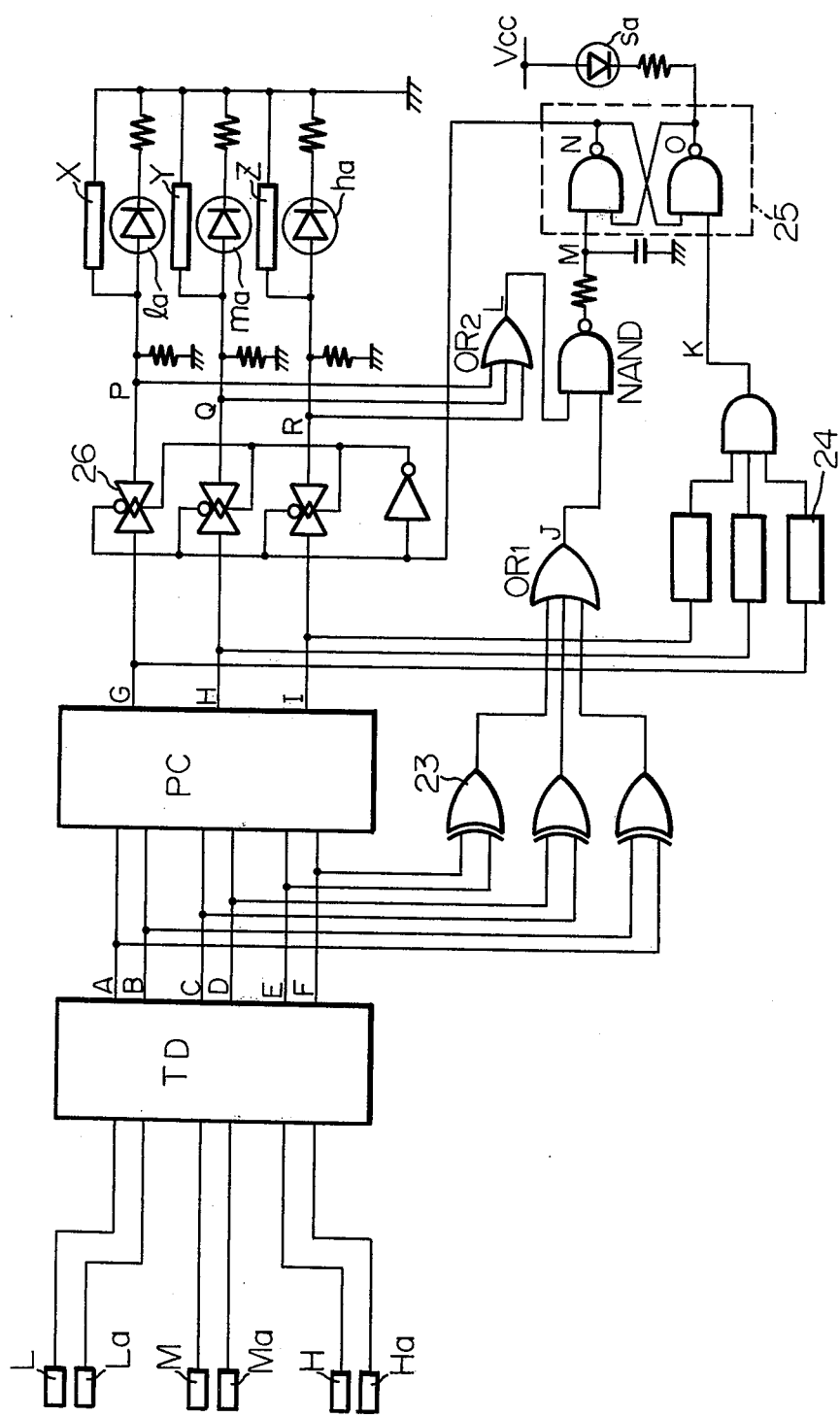
FIG_6

TOUCH SWITCH

BRIEF DESCRIPTION OF THE INVENTION

The present invention relates a touch switch, and more particularly an improved touch switch which has a couple of senior and junior electrodes and serves as a switch only when it is dealt with by particular touching in order to prevent any dangers made by erroneous operation.

There has been recently available a touch switch which turns to ON and OFF by slight touching of the finger on the electrode. Such touch switch has been employed in the sewing machines, home electrical devices and so on in view of lesser troubles because of mechanical connections, or excellent operational ability because of needing no pushing force. However, such merits of effective operation by the slight touching easily cause erroneous operation disadvantageously. For example, if the touch switch is used in the home sewing machines for starting the motor or controlling in switching the stitching speed, there happens inconvenience or accidents to hurt the operator at the finger if touching it by error during the stitching operation.

The present invention has been devised to eliminate the defects and disadvantages of the prior art. It is a primary object of the invention to promise safety by a simplified structure.

It is a second object of the invention to provide excellent operationability.

The other features and advantages of the invention will be apparent from the following description of the invention in reference to the preferred embodiments as shown in the attached drawings.

BRIEF DESCRIPTION OF THE DRAWINGS

FIG. 1 shows an outer appearance of a touch switch according to the present invention, FIG. 2 is a circuit composition of the above, FIG. 5 shows an outer appearance of another touch switch of a second embodiment according to the present invention, FIG. 6 is a circuit composition of the above, FIG. 8 shows an outer appearance of a further touch switch of a third embodiment according to the present invention.

DETAILED DESCRIPTION OF THE INVENTION

Figure 3:
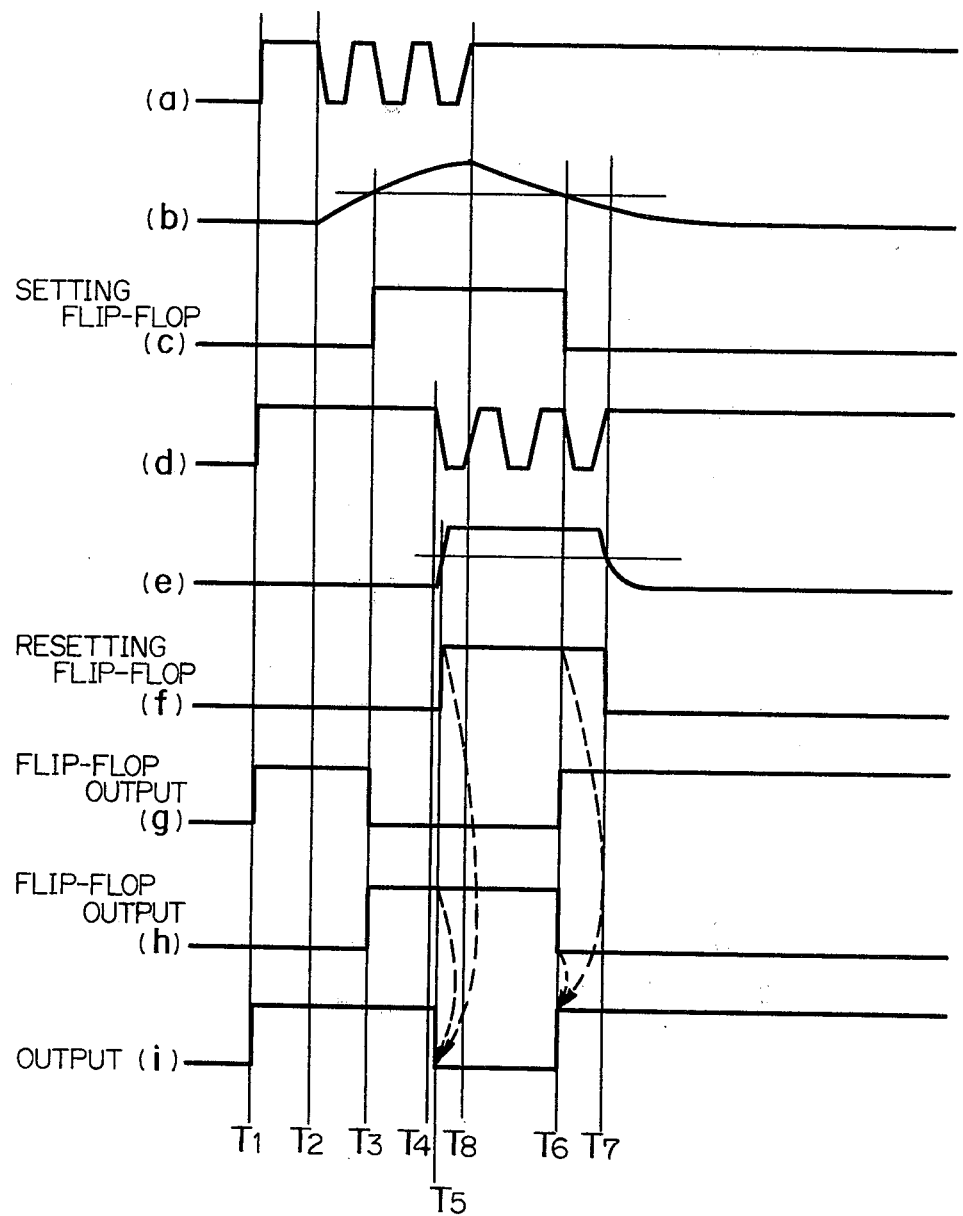
FIGS. 3 and 4 are views of explaining operations of the above.

The present invention will be explained in reference to the attached drawings. In reference to FIG. 1, the numeral 1 is a furnishing panel of a touch switch. The reference letter A is a first touch switch (senior electrode), and Aa is a second touch switch (junior electrode) positioned adjacently to the electrode A. The reference numerals 2, and 2a are frames of insulating material provided around the touch switches A, Aa respectively and a circuit composition such as shown in FIG. 2 is prepared at a rear side of the panel 1.

The operation thereof will be referred to.

At first, when the operator touches by a finger on the electrode A for the time between the timings T2 and T8 after supplying an electric source at a timing T1 (FIG. 3), the electrode A is induced with a hum such as shown with (a) in FIG. 3, and the output of IC 7 is integrated into the wave shape shown at (b) by way of a diode 8, resistors 9, 11 and a capacitor 10, and is rectified into the wave shape such as shown at (c) by way of IC 12, 13. Then the output becomes a set input of flip-flops 14, 15 for a period between the timings T3 and T6. Further when touching the electrode Aa (this is a condition (1)) at the timing T4 in such an input period, the wave shape is converted as shown at (d), (e) and (f) in the same manner as mentioned above, and is turned into a reset input of said flip-flops for a period between the timings T5 and T7. Time constant of resistors 9a, 11a and a capacitor 10a in the second touch detecting circuit is made considerably smaller than that of said resistors 9, 11 and said capacitor 10 of the first touch detecting circuit.

Since the set signal is precededly given to the flip-flops F/F in the condition (1), the output (g) is turned to L level at the timing T3 and a signal (h) is turned to H level. Subsequently, a reset signal (f) enters the flip-flops, but the output (g) is not converted and remains unchanged until the timing T6 where, after releasing the electrode A, the set signal turns to L level after a certain time passes by said time constant. Therefore, the signal (h) is at H level between the timings T3 and T6, and a signal (f) is also at H level between the timings T5 and T7, and the output (i) of NAND-IC 17 receiving the signals (h) and (f) is processed at L level between the timings T5 and T6. Thus the output (i) becomes an operating signal of the invention.

Figure 4:
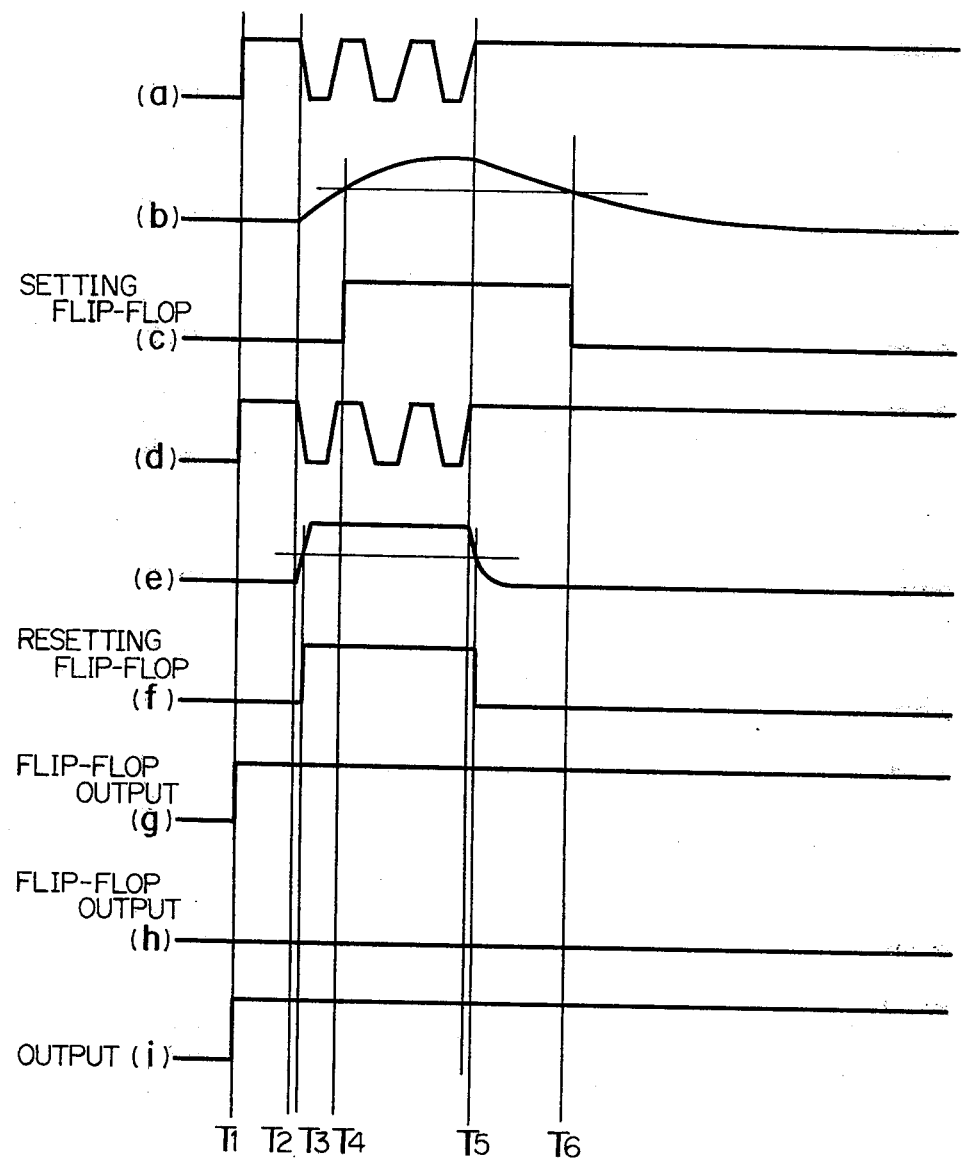

A next reference will be made to a simultaneous touching on the electrodes A, Aa (this is a condition (2)) with reference to FIG. 4. In this case, the reset signal (f) is at first given to the flip-flops 14, 15 and the signal (h) is converted to L level while the output (g) remains at H level. The output signal of the IC 17 is at H level irrespectively of the condition of the signal (f). Accordingly the operating signal (i) is not issued.

When the operator touches only the electrode A or Aa only (a condition (3)), either of the signals (h) or (f) is at L level and the output signal turns to H level as in the condition (2) and the operating signal is not issued.

When the operator touches the electrode A after touching the electrode Aa (a condition (4)), the output signal is at H level as in the condition (2) and the operating signal is not issued.

When the operator touches the electrode Aa after a certain time has passed since the operator touched the electrode A (a condition (5)), that is, when touching the electrode A at the timing T2 and releasing it at the timing T8, the set input of the flip-flops turns to H level at the timing T3, and turns to L level at the timing T6 after the elapse of a certain time from the timing T8, as shown with the signal (c) in FIG. 3. Therefore if the operator touches the electrode Aa after the timing T6, the operating signal is not issued as in the condition (3).

The first embodiment according to the invention is as mentioned above. When the operator touches the electrode Aa by the finger within a certain time after touching the electrode A as in the condition (1), that is, only when the operator rubs by the finger from the electrode A to the electrode Aa at a due speed, the operating output signal is temporalily generated. Such an operating output signal can be used to keep a switch ON, and this ON condition of the switch may be turned OFF by another means. If this is applied to the control switch of a sewing machine, any danger by accident will be prevented, if the operator touches the touch switch by error during the sewing operation so far as this touching is not particular as specified above mentioned. Furthermore said "rubbing" operation is not difficult in comparison with the existing touching operation on the electrode, while this "rubbing" operation utilizes the merits of the conventional ones. The above mentioned embodiment depends on the hum induction. This may depend on detecting the changes of the capacity of the static electricity or the changes of the earth resistance value due to the touching operation.

Another reference will be given to a second embodiment in which a numeral 21 shown in FIG. 5 is a panel which is arranged in suitable place on the machine frame, having a plurality of couples of touch switches L-La, M-Ma, H-Ha, as the touch switch A-Aa shown in the above mentioned embodiment, for controlling the speed of the machine motor at low speed, medium speed and high speed. l, m, h, and la, ma, ha are indicating letters and indicating lamps by means of LED, and are each furnished in correspondence to said switches, and a circuit composition as shown in FIG. 6 is provided at the rear side of the panel 21.

Figure 7:
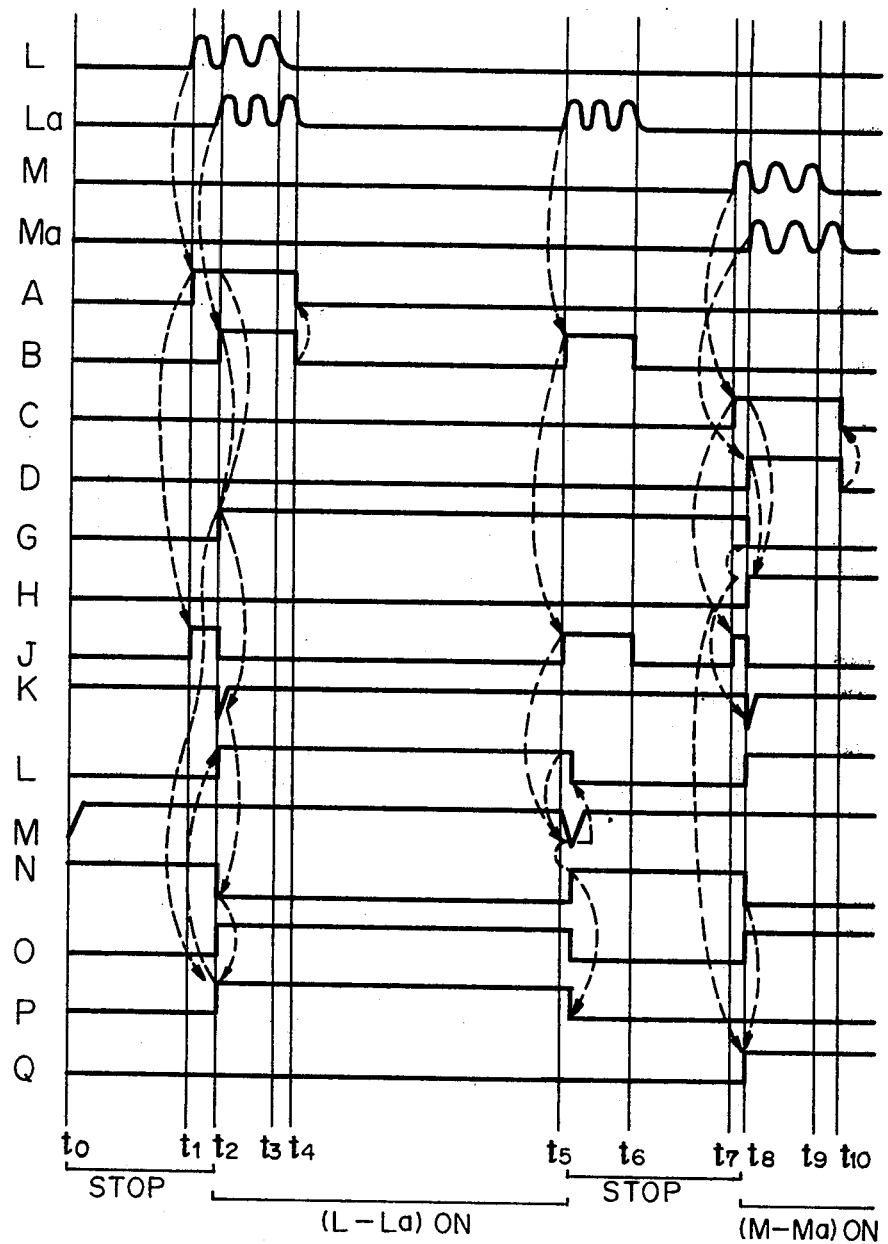
FIG. 7 is a view of explaining operation of the above.

The structure and operation of the second embodiment will be discussed in reference to FIGS. 6 and 7. TD is a touch detecting circuit. The output A, C, E of the circuit TD are kept ON for a while even if the touch electrodes L, M, H are released. The outputs B, D, F are kept ON so long as the touch electrodes La, Ma, Ha are touched. When the outputs (B), (D), (F) becomes OFF, the outputs (A), (C), (E) are made OFF. These outputs of the touch detecting circuit TD are applied to the inputs of exclusive-OR circuits 23 and to the inputs of a processing circuit PC. The outputs (G), (H), (I) of the processing circuit PC are each produced by a selective operation of the touch electrodes L-La, M-Ma, H-Ha just in the same manner as the first embodiment of the invention. The reference numeral 24 collectively indicates signal-rise detecting circuits, 25 is a flip-flop circuit, and 26 collectively indicates transmission gates which may be considered as something in place of the switches as mentioned in the first embodiment. X, Y, Z are actuators for setting the motor rotation speed, for example, of a sewing machine to a low, medium and high conditions respectively. The reference letter Sa is a lamp mounted in a suitable place of the panel 21 and indicating the stopping condition of the machine motor. When the electric source is turned to ON at the timing TO, the touch detecting circuit TD and a processing circuit PC give no output, and the output N of the flip-flop is set at H level and the output O of the other flip-flop is set at L level, and LED sa is lighted. When the electrode L is touched at a timing t1, a hum is induced, and the output (A) of the circuit TD turns to H level. Since the output (B) still remains at L level, the signal (J) becomes H level. Subsequently, when the operator touches the electrode La at a timing t2 within a certain time (corresponding to the condition (1) of the first embodiment), the output (B) of the processing circuit PC turns to H level, and at the same time the output (G) is issued, and the signal (J) is turned to L level by the exclusive-OR receiving the signals (A) and (B), and the output (K) is issued at rising of the signal (G) to reset the flip-flop circuit 25. Thus, the signal (N) becomes L level and a transmission gate 26 is conducted and the signal (G) is ready for the output (P) to operate and to light the LED la. Then the signal (O) of the flip-flop 25 becomes H level and the LED sa is turned to OFF. The signal (L) turns to H level, since the signal (P) is at H level, and subsequently when the electrode La is released at the timing t4, the signal (B) turns to L level instantaneously, and at the same time the signal (A) also turns to L level while the signals (G) and (P) continue.

Then if the electrode La is touched again at the timing t5, the signal (B) turns to H level, and since the signal (A) is at L level, the signal (J) becomes H level and the signal (L) turns to L level from H level. The flip-flop circuit 25 is set and the output (N) turns to H level and converts the signal (P) to OFF (L level) and the signal (L) also turns to L level, that is, the operating device X and LED la are deenergized, and the output (O) of the flip-flop circuit 25 turns to L level and LED sa is lighted. When the electrode La is released at the timing t6, the outputs (B) and (J) become L level, and the output (G) is switched to L level when the processing circuit PC comes to issue the output (H) or (I). The above explanation refers to touching on the electrode La at the timing t5, but even if any electrode is touched other than the electrode La, the signal (J) becomes H level and the same result is reached, that is, the device is rendered OFF.

Then if the operator touches any pair of electrodes other than the electrodes L-La in the specified way, for example, the touch switch M-Ma is operated in the specific manner, the operating device Y and LED ma are energized and LED sa is deenergized.

The second embodiment is as mentioned above. The touch switches L-La, M-Ma, H-Ha are made operative (ON) only when the operator rubs any one pair of switches from the upper to the lower, and the OFF condition is reached by touching again any desired electrode.

Figure 9:
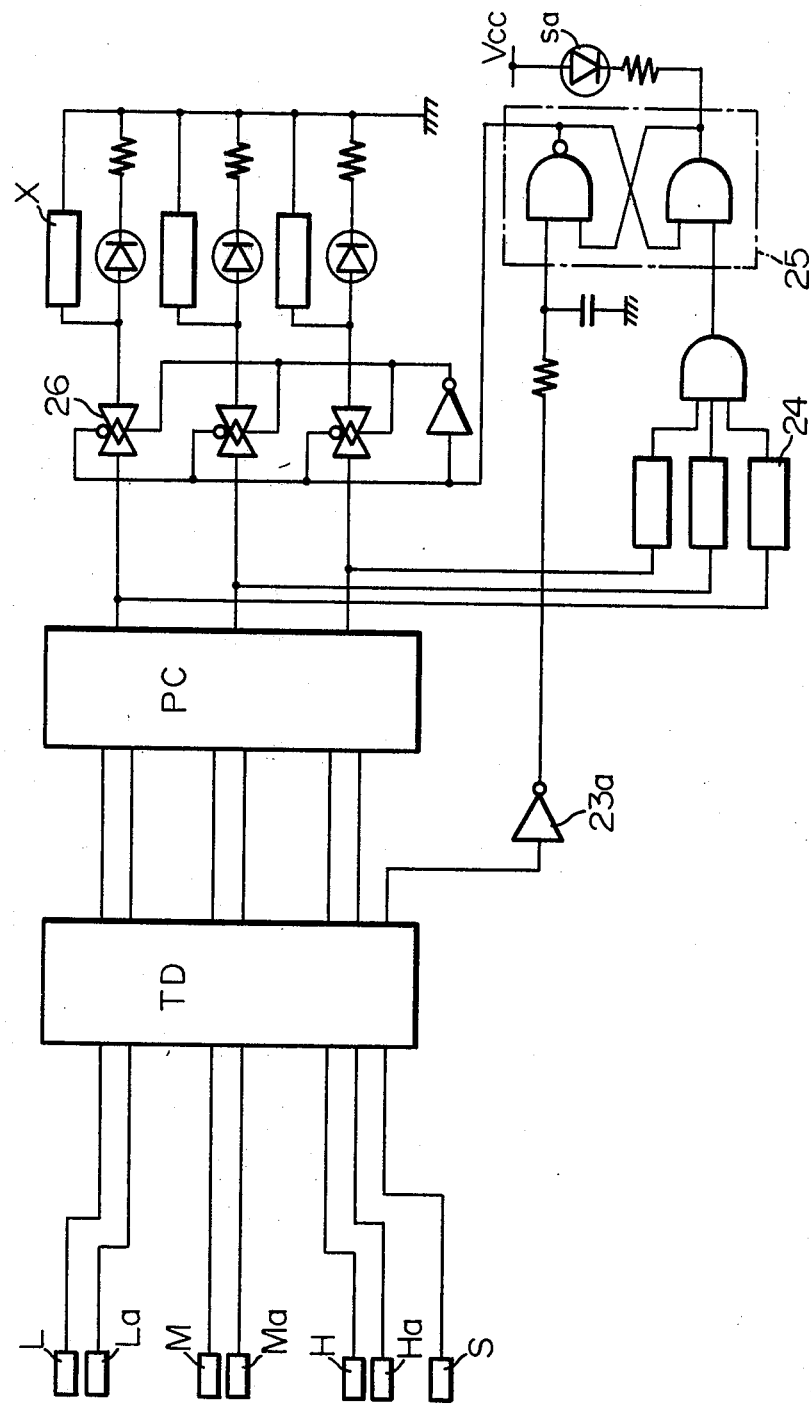
FIG. 9 is a circuit composition of the above.

The third embodiment will be explained. In FIG. 8 S designates a touch electrode to be exclusively used for turning the device to OFF, and FIG. 9 is a circuit composition thereof. Difference from the second embodiment is that the set input to the flip-flop circuit 25 is effected only by the input from the touch senser S independent of the electrodes L-La, M-Ma, H-Ha.

We claim:

1. A touch switch system for a machinery having a drive motor, comprising a first touch electrode and a second touch electrode which are adjacently arranged on a furnishing panel of the machinery and operated one by one in a predetermined sequential order within a predetermined period of time difference to produce a first electric signal and a second electric signal; and electric circuit means including a first circuit associated with said first touch electrode and a second circuit associated with said second touch electrode for setting said predetermined period of time difference, said electric circuit means further including a circuit detecting said first and second electric signals produced in said predetermined period of time difference to produce an operating output for starting the drive motor.

2. A touch system as defined in claim 1, further comprising means operated in association with one of the first and second touch electrodes to nullify said operating output.

3. A touch switch system as defined in claim 1, further comprising a separate touch switch operated in asociation with said circuit detecting said first and second electric signals to nullify the operating output.

* * * * *